United States Patent [19]

Umeki

[11] Patent Number: 4,931,999
[45] Date of Patent: Jun. 5, 1990

[54] ACCESS CIRCUIT FOR A SEMICONDUCTOR MEMORY

[75] Inventor: Tsunenori Umeki, Hyogo, Japan

[73] Assignee: Mitsubishi Denki Kabushiki Kaisha, Tokyo, Japan

[21] Appl. No.: 194,707

[22] Filed: May 17, 1988

[30] Foreign Application Priority Data

Jul. 27, 1987 [JP] Japan .................. 62-187948
Jul. 27, 1987 [JP] Japan .................. 62-187958

[51] Int. Cl.⁵ .............................................. G11C 13/00
[52] U.S. Cl. ......................... 365/230.01; 365/189.04; 365/189.05; 365/230.05
[58] Field of Search ............ 365/189, 230, 189.01, 365/189.05, 189.04, 230.01, 230.05, 230.06, 230.08, 238.5, 233, 219, 220, 221; 307/530

[56] References Cited

U.S. PATENT DOCUMENTS

| 4,602,354 | 7/1986 | Craycraft et al. | 365/189.05 |
| 4,608,672 | 8/1986 | Roberts et al. | 365/230.06 |
| 4,635,233 | 1/1987 | Matsumoto et al. | 365/189 |
| 4,656,606 | 4/1987 | Ohno et al. | 365/189 |
| 4,660,178 | 4/1987 | Hardee et al. | 365/189 |
| 4,691,298 | 9/1987 | Fukuda et al. | 365/189.05 |
| 4,758,995 | 7/1988 | Sato | 365/189 |

*Primary Examiner*—Terrell W. Fears
*Attorney, Agent, or Firm*—Townsend and Townsend

[57] ABSTRACT

A semiconductor memory includes a plurality of column selector circuits for storing data of a row memory cells specified by a row address decoder within a memory cell array and a plurality of column address decoders corresponding to the column selector circuits. The data of the row of memory cells selected by the row address decoder are stored in a plurality of column selector circuits, different address signals from the respective column address decoders are fed to the respective column selector circuits to simultaneously write or read the data in the different memory cells.

8 Claims, 4 Drawing Sheets

ACCESS CIRCUIT FOR A SEMICONDUCTOR MEMORY

BACKGROUND OF THE INVENTION

This invention relates to a semiconductor memory performing a write or read operation by decoding a row and a column address signal line.

FIG. 3 shows a conventional random access memory (RAM) such as shown in the 1985 Mitsubishi Semiconductor IC Memory Data Book published by Mitsubishi Denki. The RAM includes a memory cell array 1, a row address decoder 2, a column address decoder 3, a column selector circuit 4, a data output control signal line 5, and a data input control signal line 6, these devices being interconnected with each other as shown in the figure.

In operation, the row address decoder 2 decodes n input address signals and activates one of m row address signals and feeds it to the memory cell array 1. The column address decoder 3 decodes i input address signals and activates one of k column address signals and feeds it to the column selector circuit 4. The memory cell array 1 feeds the column selector circuit 4 with the data of b memory cells (not shown) sharing the common word line specified by the row address decoder 2. When the data output control signal line 5 is activated, the column selector circuit 4 selects the data specified by the column address decoder 3 from the b data and outputs it.

Where data is written in the memory cell array 1, the write position is specified in the same manner as described above and, then, the data input control signal line 6 is activated to allow data input from the outside.

FIG. 4 shows a conventional semiconductor read only memory (ROM). The ROM allows read only so that neither data output control signal line 5 nor data input control signal line 6 is provided and data is output from the column selector circuit 4.

As described above, neither conventional RAM nor ROM is able to read simultaneously a plurality of data of different addresses so that it takes a great amount of time to read a plurality of data.

SUMMARY OF THE INVENTION

Accordingly, it is an object of the invention to provide a semiconductor memory capable of reading simultaneously a plurality of data of different addresses, thus shortening the data read time.

According to the invention, there are added to the conventional semiconductor memory at least one column selector circuit and at least one column address decoder in such a manner that when a word line is selected by the row address decoder, a plurality of data in the word line are fed to a plurality of column selector circuits to which different address signals are fed so that the respective column selector circuits read data of the different addresses simultaneously.

Other objects, features, and advantages of the invention will be apparent from the following description taken in conjunction with the accompanying drawings.

DESCRIPTION OF THE PREFERRED EMBODIMENT

Figure 1:
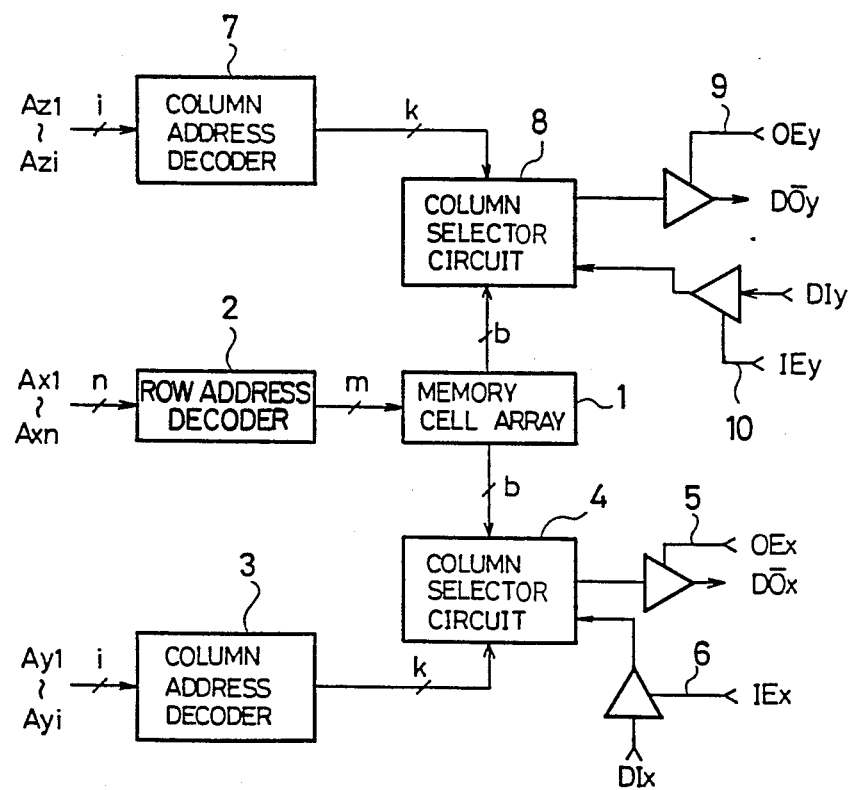
FIG. 1 is a block diagram of a semiconductor random access memory according to an embodiment of the invention.
Figure 3:
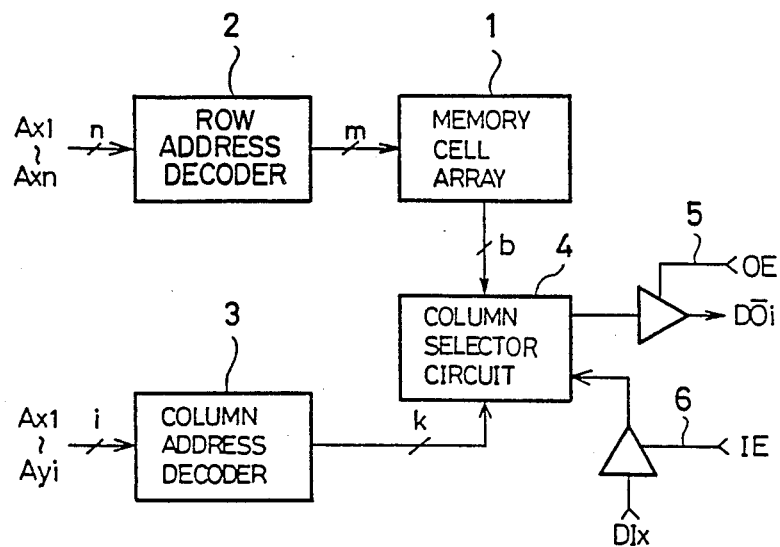
FIG. 3 is a block diagram of a conventional semiconductor random access memory.
Figure 4:
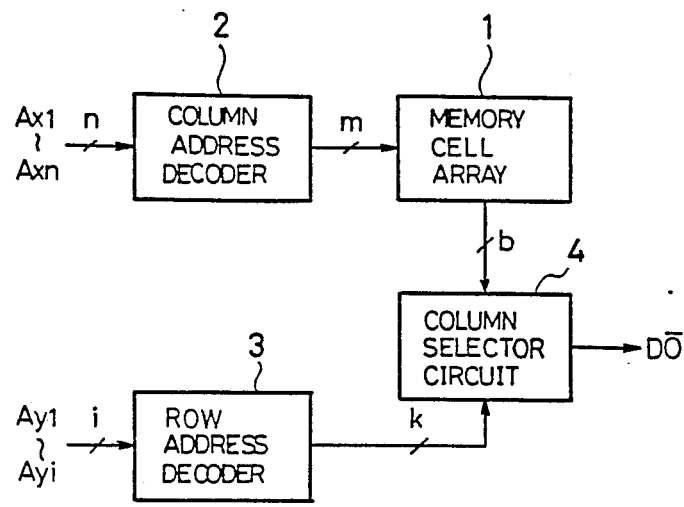
FIG. 4 is a block diagram of a conventional semiconductor read only memory.

FIG. 1 shows a random access memory (RAM) according to an embodiment of the invention, in which like reference numerals denote identical or equivalent parts or components of FIG. 3. This RAM further includes a column address decoder 7 having the same function as that of the column address decoder 3, a column selector circuit 8 having the same function as that of the column selector circuit 4, a data output control signal line 9, and a data input control signal line 10.

In operation, the RAM has a plurality of column selector circuits so that when the row address decoder 2 selects one of the word lines within the memory cell array 1, the data of b memory cells sharing the common word line are fed to the respective column selector circuits 4 and 8. Consequently, when different address signals are input to the column address decoders 3 and 7 corresponding to the column selector circuits 4 and 8, the data of different addresses are selected and output simultaneously, thus providing a function equivalent to the high-speed RAM access.

The write operation may be made in the same manner as described above and, therefore, detailed description will be omitted.

Figure 2:
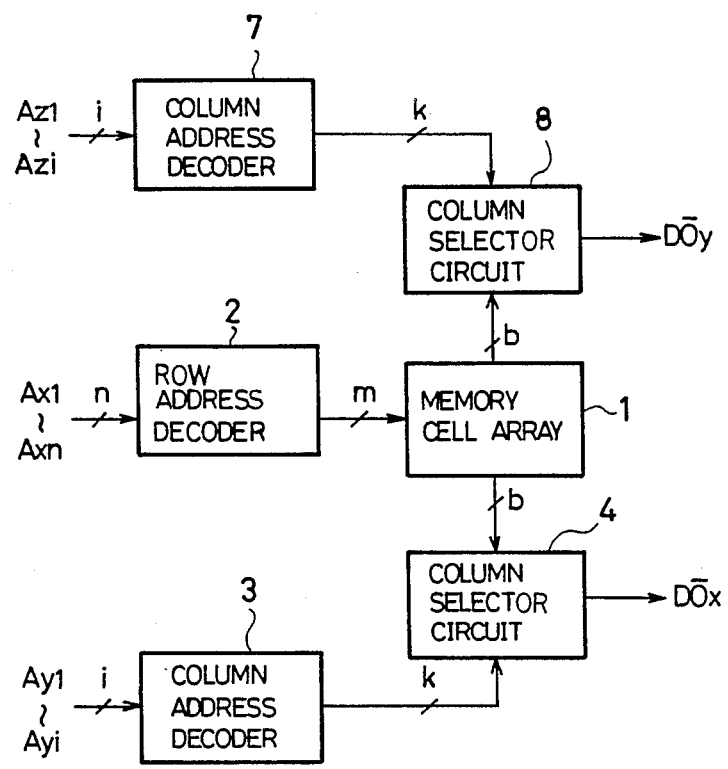
FIG. 2 is a block diagram of a semiconductor read only memory according to another embodiment of the invention.

FIG. 2 shows a read only memory according to another embodiment of the invention. Unlike the RAM, the ROM allows read only so that there are no data output and input control lines. After one of the word lines within the memory cell array 1 is selected by the row address decoder 2 and the data of b memory cells sharing the common word line are fed to the column selector circuit 4 and 8, different address signals are input to the column address decoders 3 and 7 each corresponding to the column selector 4 and 8 to select and output simultaneously the data of different addresses.

The above semiconductor memories have two column address decoders 3 and 7 but may have three or more column address decoders to provide similar results. The present invention is also very useful for microcomputers having a read only memory for storing programs and a plurality of functional blocks which operate according to the contents of the programs.

While a preferred embodiment of the invention has been described using specific terms, such description is given for illustrative purposes only, and it is to be understood that changes and variations may be made without departing from the spirit and scope of the invention as recited in the appended claims.

What is claimed is:

1. An access circuit for a semiconductor memory including a plurality of data storage locations disposed in rows and columns, comprising:
    a memory cell array having a first and a second word line, each word line coupling a first and a second data storage location of a particular row to a first and a second column, respectively, when asserted;
    a row address decoder, coupled to said memory cell array and responsive to a row address signal, for selecting said particular row by asserting a particular word line;

a first and a second substantially identical column selector circuit, coupled to said first and second columns of said memory cell, for independently selecting a particular one of said first and said second columns in response to a first column address signal received at said first column selector circuit and a second column address signal received at said second column selector circuit;

a first column address decoder, coupled to said first column selector and responsive to a first column address, for asserting said first column address signal to select said first column to access said first data storage location; and a second column address decoder, substantially identical to said first column address decoder and coupled to said second column selector, said second column address decoder responsive to a second column address independent from said first column address to assert said second column address signal to select said second column and thereby access said second data storage location in response to a second column address signal substantially with said assertion of said first column address signal.

2. The semiconductor memory of claim 1, which comprises a random access memory to write or read data depending on an input control signal.

3. The semiconductor memory of claim 1, which comprises a read only memory.

4. An access circuit array for selecting from data stored in a plurality of data storage locations coupled to a particular word line accessed from a memory array in response to a row address signal, a first and a second bit, comprising:

a first and a second column selector circuit coupled to a plurality of bit lines of the memory array for receiving the data coupled to a particular word line, each bit line coupled to a column of data storage locations of said memory array, said first and second column selector circuits responsive to a first and second column address signal, respectively, to select a particular bit line;

a first column address decoder coupled to said first column selector circuit for decoding a first address and asserting said first column address signal and selecting the first bit from said received data corresponding to said first address; and a second column address decoder coupled to said second column selector circuit for decoding a second address independent from said first address and asserting said second column address signal and selecting the second bit from said received data corresponding to said second address.

5. An access circuit of claim 4 wherein said first and said second column selector circuits receive said data substantially simultaneously.

6. In a memory array having a plurality of data storage locations disposed in rows and columns with a word line coupled to each of the rows and a bit line coupled to each of the columns such that when a particular word line is asserted each of the data storage locations of the particular row coupled to the particular word line are coupled to the bit lines wherein the particular word line is asserted in response to a first address received at a row decoder coupled to each word line and wherein a particular bit line is selected in response to a second address received at a column decoder which asserts a column address signal and a column selector circuit coupled to the bit lines selects the particular bit line in response to the column address signal to thereby select a particular one of the plurality of data storage locations, the improvement comprising:

a second column address decoder, substantially identical to the column address decoder, for asserting a second column address signal in response to a third address independent from the second address; and a second column selector circuit, coupled to the bit lines and substantially identical to the column selector circuit, for selecting a second particular bit line in response to said second column address signal substantially simultaneously with the selection of the particular bit line to thereby select a second particular one of the plurality of data storage locations from the particular word line substantially simultaneously with the selection of the particular one of the plurality of data storage locations.

7. An access circuit for addressing a memory cell array having a plurality of data storage locations disposed in rows and columns with a word line coupled to each row and a bit line coupled to each column wherein each data storage location of a particular row are coupled to a bit line in response to the word line of the particular row being asserted, comprising:

a row address decoder, coupled to the word lines and responsive to a first address, for asserting a particular word line;

a first column address decoder, responsive to a second address, for decoding said second address and asserting a first column address signal;

a first column selector circuit, coupled to the bit lines and responsive to said first column address signal, for selecting a first particular one of said bit lines to access a first one of the plurality of data storage locations of the particular row;

a second column address decoder, substantially identical to said first column address decoder and responsive to a third address independent from said second address, for decoding said third address and asserting a second column address signal substantially simultaneously with said decoding of said second address and assertion of said first column address signal; and a second column selector circuit, substantially identical to said first column selector circuit and coupled to said bit lines, said second column selector responsive to said second column address signal for selecting a second particular one of said bit lines to access a second one of said plurality of data storage locations of said particular row substantially simultaneously with said selection of said first particular one of said plurality of data storage locations.

8. A method for selecting a first and a second data storage location from a particular row of a memory storage device having a plurality of data storage locations disposed in rows and columns with a word line coupled to each data storage location of a row and a bit line coupled to each data storage location of a column, comprising the steps of:

decoding a first address to assert a particular word line coupled to the particular row;

coupling each of the data storage locations of said particular row to the bit line coupled to said data storage locations;

decoding a second address to assert a first column address signal;

decoding a third address independent from said second address to assert a second column address signal substantially simultaneously with said step of decoding said second address;

selecting a first bit line in response to said first column address signal to access the first data storage location; and selecting a second bit line in response to said second column address signal to access the second data storage location substantially simultaneously with said access of said first data storage location.

* * * * *